(12) United States Patent
Lin et al.

(10) Patent No.: US 8,923,078 B2
(45) Date of Patent: Dec. 30, 2014

(54) VOLTAGE DIVIDER CONTROL CIRCUIT

(71) Applicant: Taiwan Semiconductor Manufacturing Company Limited, Hsin-Chu (TW)

(72) Inventors: Yangsyu Lin, New Taipei (TW); Hsin-Hsin Ko, Hsinchu (TW); Chiting Cheng, Taichung (TW); Jonathan Tsung-Yung Chang, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/751,240

(22) Filed: Jan. 28, 2013

(65) Prior Publication Data
US 2014/0211574 A1 Jul. 31, 2014

(51) Int. Cl.
*G11C 7/00* (2006.01)
*H03K 17/284* (2006.01)

(52) U.S. Cl.
CPC ............... *H03K 17/284* (2013.01); *G11C 7/00* (2013.01)
USPC .................. 365/189.11; 365/201; 365/225.7; 365/189.09

(58) Field of Classification Search
CPC ...... G11C 5/147; G11C 11/4074; G05F 3/02; H02M 2003/072
USPC .................. 365/201, 225.7, 189.09
See application file for complete search history.

(56) References Cited

U.S. PATENT DOCUMENTS

2012/0020162 A1* 1/2012 Stiegler et al. ........... 365/185.18

OTHER PUBLICATIONS

"A 4.6GHz 12Mb SRAM Design in 22nm Tri-Gate CMOS Technology with Integrated Active VMIN-Enhancing Assist Circuitry", Eric Karl, Yih Wang, Yong-Gee Ng, Zheng Guo, Fatih Hamzaoglu, Uddalak Bhattacharya, Kevin Zhang, Kaizad Mistry and Mark Bohr, Feb. 21, 2012, IEEE International Solid-State Circuits Conference, Session 13, High-Performance Embedded SRAM, pp. 230-232.

* cited by examiner

*Primary Examiner* — Thong Q Le
(74) *Attorney, Agent, or Firm* — Cooper Legal Group, LLC (57) ABSTRACT

One or more techniques or systems for controlling a voltage divider are provided herein. In some embodiments, a control circuit is configured to bias a pull up unit of a voltage divider using an analog signal, thus enabling the voltage divider to be level tunable. In other words, the control circuit enables the voltage divider to output multiple voltage levels. Additionally, the control circuit is configured to bias the pull up unit based on a bias timing associated with a pull down unit of the voltage divider. For example, the pull up unit is activated after the pull down unit is activated. In this manner, the control circuit provides a timing boost, thus enabling the voltage divider to stabilize more quickly.

20 Claims, 10 Drawing Sheets

VOLTAGE DIVIDER CONTROL CIRCUIT

BACKGROUND

Generally, a voltage divider is a circuit for producing an output voltage. For example, a voltage divider may output a voltage that is a fraction of an input voltage. However, some voltage dividers are associated with slow stabilization times. Additionally, a voltage divider is generally associated with an output voltage.

BRIEF DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

Figure 1:
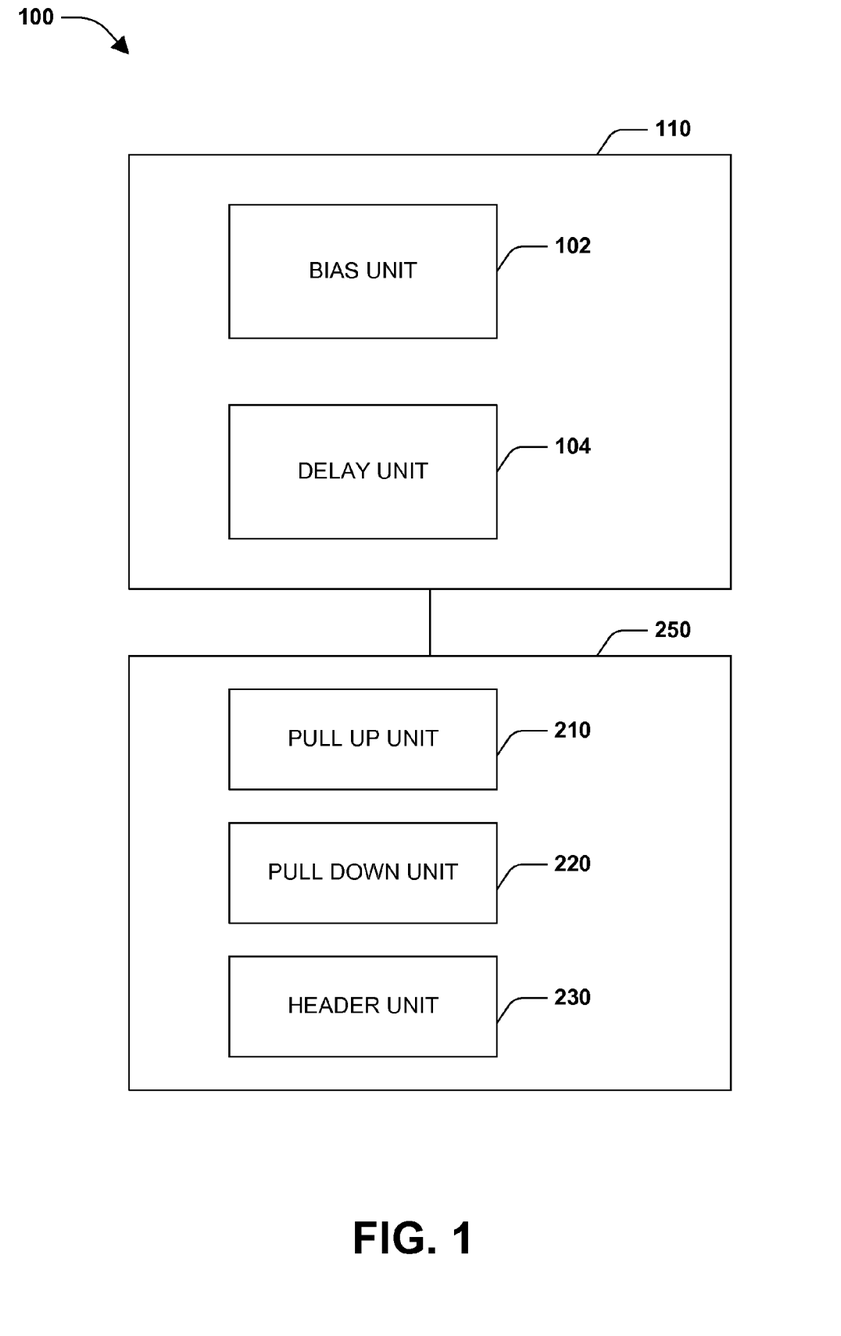
FIG. 1 is a schematic diagram of an example control circuit, according to some embodiments.

FIG. 1 is a schematic diagram 100 of an example control circuit, according to some embodiments. In some embodiments, a control circuit 110 comprises a bias unit 102 and a delay unit 104. In some embodiments, the control circuit 110 is configured to bias a voltage divider 250. In some embodiments, the voltage divider 250 comprises a pull up unit 210, a pull down unit 220, and a header unit 230. In some embodiments, at least one of the control circuit 110 or the bias unit 102 is configured to bias the pull up unit 210 of a voltage divider 250. In some embodiments, at least one of the control circuit 110 or the bias unit 102 is configured to facilitate the biasing by providing an analog signal to the pull up unit 210 of the voltage divider 250. In some embodiments, the analog signal is associated with a voltage, such as a voltage between a logic low voltage level and a logic high voltage level. In this way, the pull up unit 210 of the voltage divider 250 is biased, for example. In some embodiments, the header unit 230 is configured to generate a header signal, for example. In some embodiments, the control circuit 110 is configured to bias the voltage divider by generating a Vbias signal. In some embodiments, the control circuit 110 comprises at least one of a p-p voltage divider, an n-n voltage divider, a p-n voltage divider, an n-p voltage divider, a diode type voltage divider, etc.

In some embodiments, the pull up unit 210 of the voltage divider 250 is a p-type metal oxide semiconductor (PMOS) transistor. In other embodiments, the pull up unit 210 is an n-type metal oxide semiconductor (NMOS) transistor. For example, when a logic low voltage level is applied to a gate of an NMOS transistor, the NMOS transistor turns off, thus forming an open circuit between a source of the NMOS transistor and a drain of the NMOS transistor. Conversely, when a logic low voltage level is applied to a gate of a PMOS transistor, the PMOS transistor turns on, thus forming a short circuit between a source of the PMOS transistor and a drain of the PMOS transistor. For example, when a logic high voltage level is applied to a gate of an NMOS transistor, the NMOS transistor turns on, thus forming a short circuit between a source of the NMOS transistor and a drain of the NMOS transistor. Conversely, when a logic high voltage level is applied to a gate of a PMOS transistor, the PMOS transistor turns off, thus forming an open circuit between a source of the PMOS transistor and a drain of the PMOS transistor. In some embodiments, when a transistor is turned on, a channel is formed, thus enabling current to flow between a source and a drain of the transistor. In some embodiments, the control circuit is configured to bias at least one of a p-type metal oxide semiconductor (PMOS) pull up unit 210, an n-type metal oxide semiconductor (NMOS) pull up unit, a PMOS pull down unit, or an NMOS pull down unit. In some embodiments, at least one of the control circuit 110 or the bias unit 102 is configured to bias a pull up unit 210 in at least one of a linear operation mode or a saturation operation mode. For example, the control circuit 110 or the bias unit 102 is configured to bias the pull up unit 210 such that the pull up unit 210 operates similarly to a resistor, at least because the control circuit 110 or the bias unit is configured to control a voltage applied to a gate of the pull up unit 210 relative to at least one of a source of the pull up unit 210 or a drain of the pull up unit 210. In some embodiments, at least one of the control circuit 110 or the bias unit 102 is configured to bias the pull up unit 210 to a logic low voltage level. When the pull up unit 210 is biased to the logic low voltage level, a voltage divider 250 associated with the pull up unit 210 outputs a first voltage level. In some embodiments, at least one of the control circuit 110 or the bias unit 102 is configured to bias the pull up unit 210 to a Vppu1 voltage level above the logic low voltage level and below a logic high voltage level. When the pull up unit 210 is biased to the Vppu1 voltage level, the voltage divider 250 associated with the pull up unit 210 outputs a second voltage level. In some embodiments, at least one of the control circuit 110 or the bias unit 102 is configured to bias the pull up unit 210 to a Vppu2 voltage level above the Vppu1 voltage level and below a logic high voltage level. In some embodiments, a Vppu3 voltage level is above the Vppu2 voltage level. When the pull up unit 210 is biased to the Vppu2 voltage level, the voltage divider 250 associated with the pull up unit 210 outputs a third voltage level, for example. In some embodiments, the first voltage level is above a logic low voltage level, the third voltage level is below a logic high voltage level, and the second voltage level is between the first voltage level and the third voltage level. In this way, the control circuit 110 is configured to provide multiple voltage levels for the pull up unit 210 of the voltage divider 250. For example, the control circuit is configured to bias the pull up unit 210 of the voltage divider 250 based on at least one of a first voltage level, a second voltage level, or a third voltage level. Accordingly, the control circuit thus enables the voltage divider 250 to be level tunable, for example. In some embodiments, a voltage divider 250 is associated with synchronous random access memory (SRAM) cells. Additionally, it will be appreciated that the multiple voltage levels provided by the control circuit 110 is not associated with a large area penalty, at least because multiple voltage dividers or multiple pull up units are not required, for example. In some embodiments, the control circuit 110 is configured to bias the pull up unit 210 of the voltage divider 250, for example.

It will be appreciated that merely one control circuit 110 and voltage divider 250 is capable of operating an array of one or more memory cells, as will be described in more detail in FIG. 8. In some embodiments, a memory cell array comprises one or more memory cells. In some embodiments, a control circuit 110 is configured to operate one or more corresponding voltage dividers for a plurality of arrays of one or more memory cells, as will be described in more detail in FIG. 9. For example, a control circuit 110 is configured to bias a plurality of voltage dividers using an analog signal associated with a Vppu voltage level. Additionally, respective voltage dividers are associated with one or more memory cell arrays. In some embodiments, one or more control circuits are configured to operate one or more corresponding voltage dividers for a plurality of arrays of one or more memory cells, as will be described in more detail in FIG. 10.

In some embodiments, at least one of a delay unit 104 or the control circuit 110 is configured to bias a pull up unit 210 of a voltage divider 250 based on a bias timing associated with a pull down unit 220 of the voltage divider 250. In some embodiments, the pull down unit 220 of the voltage divider 250 is activated before the pull up unit 210 of the voltage divider 250 is activated, at least due to the bias timing, for example. Accordingly, this enables the voltage divider 250 to pull a load associated with the voltage divider 250 to a stable level quickly, at least because the pull up unit 210 of the voltage divider 250 is off during a delay time (Tppu), for example. In this way, the delay unit 104 is configured to provide a timing boost to the voltage divider 250 by delaying activation of the pull up unit 210, thus mitigating the pull up unit 210 from "fighting" the pull down unit 220 during a delay time or delay period (Tppu), for example. In some embodiments, the voltage divider 250 is associated with a write assist for SRAM cells and delaying activation of the pull up unit 210 enhances write assist performance, at least because a load associated with the voltage divider 250 is pulled down more quickly when the pull up unit 210 is off during the delay time. In some embodiments, the delay unit 210 is configured to generate the Tppu delay time. In some embodiments, at least one of the delay unit 104 or the control circuit 110 is configured to bias the pull up unit 210 of the voltage divider 250 based on a transistor size associated with the pull up unit 210. For example, in some embodiments, if the transistor size is greater than a transistor size of the pull down unit 220, a longer delay time is implemented. In other words, the control circuit 110 or the delay unit 104 is configured to bias the pull up unit 210 of the voltage divider 250 after a longer delay time at least because the transistor size of the pull up unit 210 is greater than the transistor size of the pull down unit 220. In some embodiments, the control circuit 110 or the delay unit 104 is configured to bias the pull up unit 210 of the voltage divider 250 based on a transistor size associated with the pull down unit 220. In some embodiments, at least one of the control circuit 110 or the delay unit 104 is configured to delay the bias of the pull up unit 210, such as relative to a bias of the pull down unit 220 of the voltage divider 250. In some embodiments, the delay time is based on at least one of a transistor size of the pull up unit 210 or a transistor size of the pull down unit 220. In some embodiments, the control circuit 110 or the delay unit 104 is configured to be timing controllable such that the pull up unit 210 of the voltage divider 250 is turned on later than the pull down unit 220 of the voltage divider 250.

Figure 2:
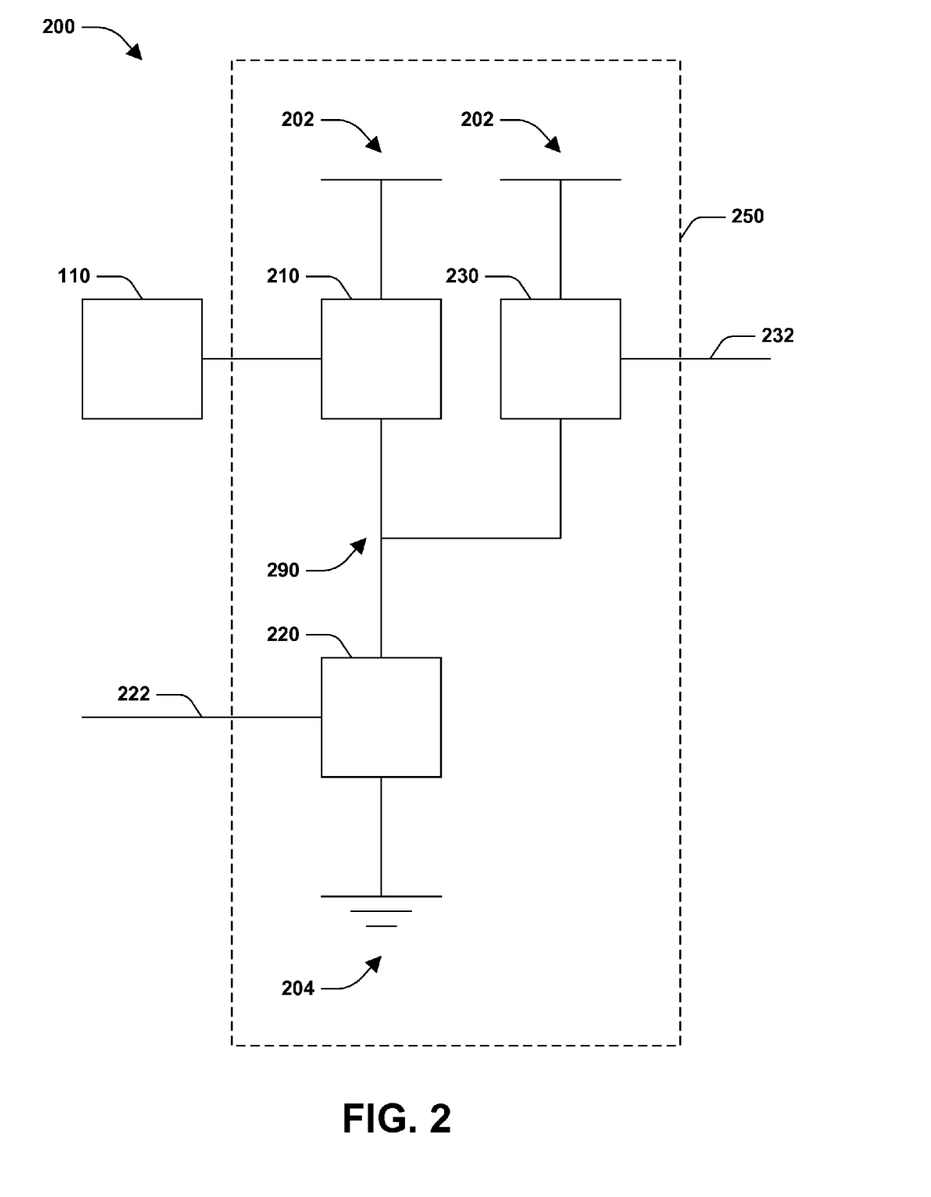
FIG. 2 is a schematic diagram of an example control circuit, according to some embodiments.

FIG. 2 is a schematic diagram 200 of an example control circuit, according to some embodiments. In some embodiments, a control circuit 110 is connected to a pull up unit 210 of a voltage divider 250. In some embodiments, the voltage divider 250 comprises the pull up unit 210 of the voltage divider 250, a pull down unit 220, and a header unit 230. In some embodiments, the header unit 230 comprises a header gate 232 connected to a first signal. For example, the first signal is configured to bias the header unit 230. In some embodiments, the first signal activates the header unit 230, thereby connecting the header unit 230 to a positive supply voltage (Vdd) 202. In this way, an output 290 of the voltage divider 250 is pulled towards Vdd 202, for example. In some embodiments, the pull down unit 220 comprises a pull down gate 222 connected to a second signal. For example, the second signal is configured to bias the pull down unit 220. In some embodiments, the second signal activates the pull down unit 220, thereby connecting the pull down unit 220 to a negative supply voltage (Vss) 204. In this way, the output 290 of the voltage divider 250 is pulled closer to Vdd 202, for example. In some embodiments, the pull up unit 210 is connected to Vdd 202. Similarly, the header unit 230 is connected to Vdd 202. In some embodiments, the pull down unit 220 is connected to Vss 204. In some embodiments, the pull up unit 210 is connected to at least one of the pull down unit 220, the header unit 230, or the control circuit 110. In some embodiments, the control circuit 110 is connected to the voltage divider 250. For example, the control circuit 110 is configured to bias the pull up unit 210 using an analog signal. In some embodiments, the analog signal is associated with one or more voltage levels. For example, a voltage level is between a logic low voltage level and a logic high voltage level. Additionally, a voltage level between the logic low voltage level and the logic high voltage level, such as a Vppu1 voltage level, Vppu2 voltage level, Vppu3 voltage level, etc. is applied to the pull up unit 210. In this way, the pull up unit 210 is active within at least one of a linear region of operation or a saturation region of operation, for example. Accordingly, the analog signal provided by the control circuit 110 enables the voltage divider 250 to output 290 multiple voltages, thus enabling the voltage divider 250 to be level tunable while mitigating space or area requirements, at least because multiple voltage dividers or multiple pull up units are not required, such as for respective voltage levels, for example. In some embodiments, the control circuit 110 is configured to disable the pull up unit 210 during a delay time during which the pull down unit 220 is active. In this way, the control circuit 110 delays activation of the pull up unit 210. For example, the pull down unit 220 pulls a load associated with the voltage divider down to a desired level during a delay time. In some embodiments, the delay time is based on an output 290 of the voltage divider 250, for example. That is, the pull up unit 210 is not activated until the output 290 of the voltage divider 250 reaches the desired voltage level, according to some embodiments. In this way, the control circuit 110 is configured to provide a timing boost, at least because pull down unit 220 of the voltage divider 250 pulls a load down more quickly when the pull up unit 210 is not active or fighting the pull down unit 220. In some embodiments, the voltage divider 250 is associated with one or more SRAM cells. In some embodiments, the voltage divider is associated with a write assist operation for at least some of the SRAM cells. In some embodiments, the pull up unit 210 is at least one of a PMOS transistor or an NMOS transistor. Similarly, the pull down unit 220 is at least one of a PMOS transistor or an NMOS transistor. Additionally, the header unit 230 is at least one of a PMOS transistor or an NMOS transistor. In this way, the voltage divider 250 is associated with at least one of four configurations, for example. In some embodiments, the voltage divider 250 is associated with a PMOS pull up unit 210 and a PMOS pull down unit 220. In some embodiments, the voltage divider 250 is associated with a PMOS pull up unit 210 and a NMOS pull down unit 220. In some embodiments, the voltage divider 250 is associated with a NMOS pull up unit 210 and a PMOS pull down unit 220. In some embodiments, the voltage divider 250 is associated with a NMOS pull up unit 210 and a NMOS pull down unit 220.

Figure 3:
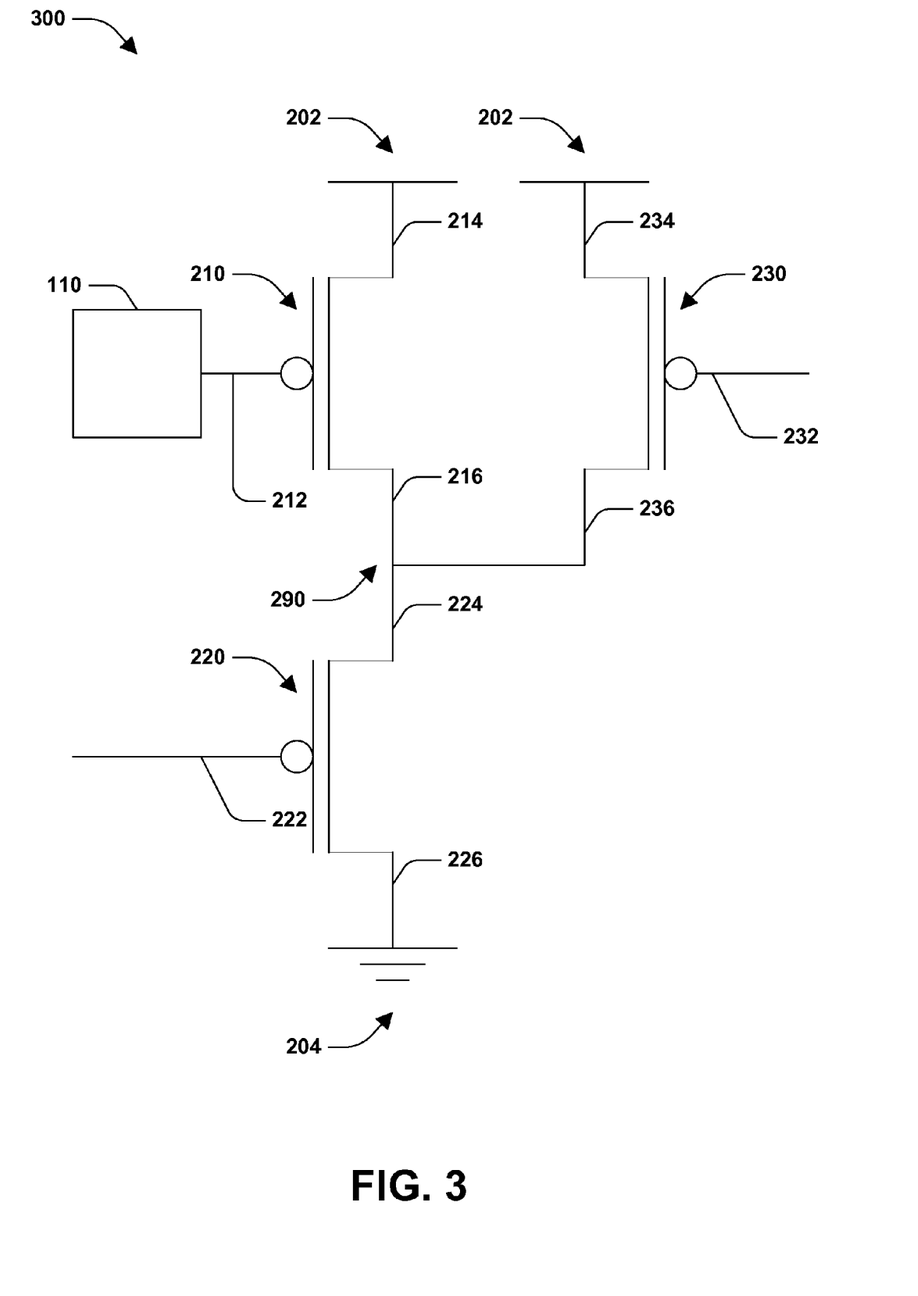
FIG. 3 is a schematic diagram of an example control circuit, according to some embodiments.

FIG. 3 is a schematic diagram 300 of an example control circuit, according to some embodiments. FIG. 3 illustrates an example embodiment similar to FIG. 2, for example. In some embodiments, the voltage divider 250 of FIG. 2 comprises a pull up unit 210, a pull down unit 220, and a header unit 230. In some embodiments, at least one of the pull up unit 210, the pull down unit 220, or the header unit 230 is a PMOS transistor. For example, the control circuit 110 of FIG. 3 is connected to a voltage divider, such as the voltage divider 250 of FIG. 2, for example. In some embodiments, the pull up unit 210 comprises a pull up PMOS transistor comprising a pull up gate 212, a pull up source 214, and a pull up drain 216. In some embodiments, the pull down unit 220 comprises a pull down PMOS transistor comprising a pull down gate 222, a pull down source 224, and a pull down drain 226. In some embodiments, the header unit 230 comprises a header PMOS transistor comprising a header gate 232, a header source 234, and a header drain 236. In some embodiments, the pull up gate 212 is connected to the control circuit 110. In some embodiments, the header gate 232 is connected to a first signal. For example, when the first signal is a logic low voltage level, the header unit 230 is activated or turned on. Accordingly, the header source 234 is shorted to Vdd 202 and the header drain 236. In this way, an output 290 of the voltage divider is pulled towards Vdd 202, for example. In some embodiments, the pull down gate 222 is connected to a second signal. Similarly, when the second signal is a logic low voltage level, the pull down unit 220 is activated or turned on. Accordingly, the pull down source 224 is shorted to Vss 204 via the pull down drain 226. In this way, the output 290 of the voltage divider is pulled towards Vss 204, for example. In some embodiments, at least one of the pull up source 214 or the header source 234 is connected to a positive supply voltage (Vdd) 202. In some embodiments, the pull down drain 226 is connected to a negative supply voltage (Vss) 204. In some embodiments, the output 290 of the voltage divider is connected to at least one of the pull up drain 216, the header drain 236, or the pull down source 224. In some embodiments, the pull up gate 212 or the pull down gate 222 activate the pull up unit 210 or the pull down unit 220 when biased with a logic low voltage level, respectively. In some embodiments, the control circuit 110 is configured to bias the pull up unit 210 with an analog signal between at least one of a logic low voltage level and a logic high voltage level. Accordingly, the analog signal enables the pull up unit 210 to operate in at least one of a linear region or a saturation region, such that the pull up unit 210 operates proportionally to the analog signal biased to the pull up gate 212, for example. In some embodiments, the control circuit 110 is configured to delay biasing the pull up unit 210 or the pull up gate 212, at least during a delay time when the pull down unit 220 is being biased or activated, for example. In this example, the timing diagram 400 of Fig. illustrates one or more signal associated with the control circuit 110 or the voltage divider of FIG. 3, for example. In some embodiments, the control circuit 110 is configured to generate a Vbias signal to facilitate biasing of the pull up unit 210, for example.

Figure 4:
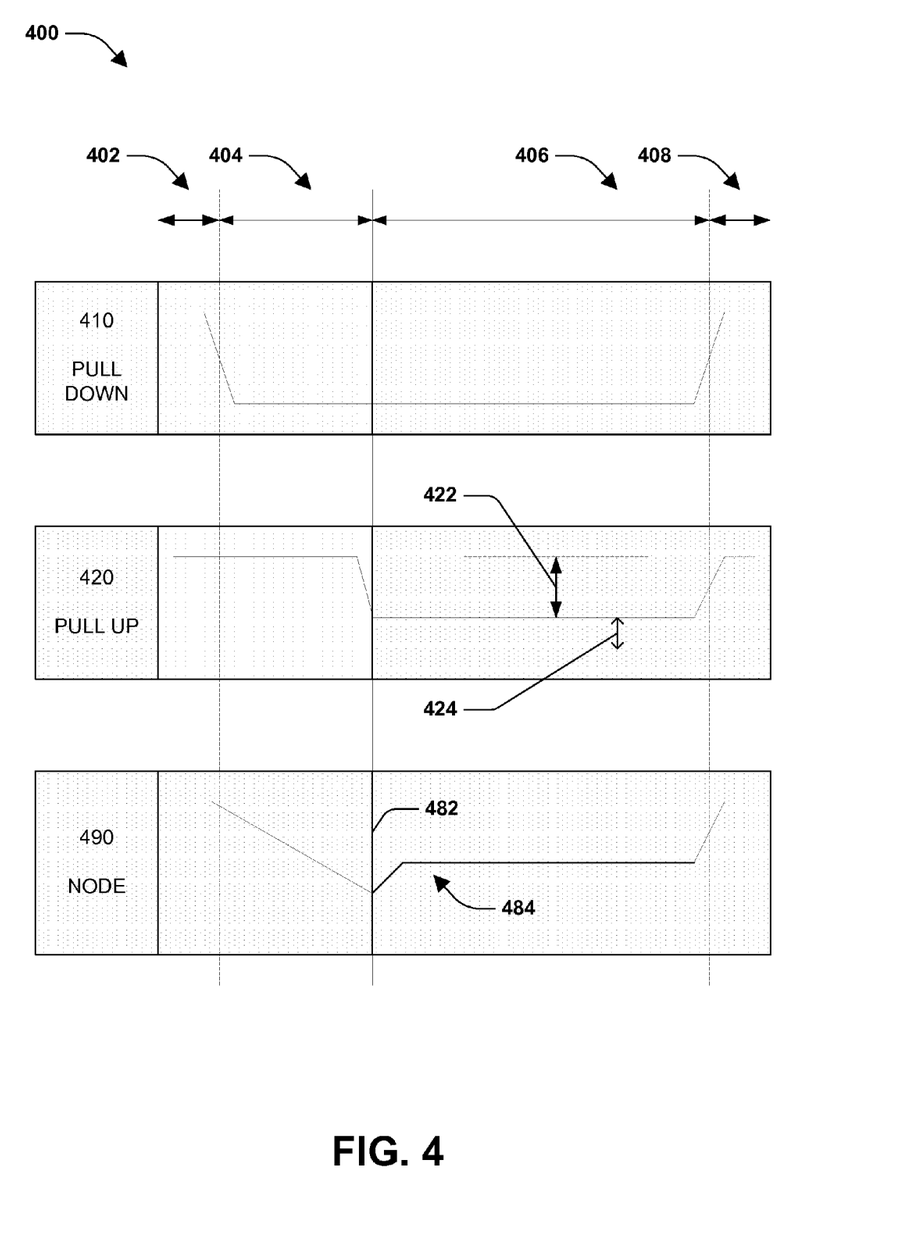
FIG. 4 is a timing diagram associated with an example control circuit, according to some embodiments.

FIG. 4 is a timing diagram 400 associated with an example control circuit, according to some embodiment. In some embodiments, 410 is a signal at least one of associated with or applied to the pull down gate 222 of FIG. 3, for example. In some embodiments, 420 is a signal at least one of associated with or applied to the pull up gate 212 of FIG. 3, for example. In some embodiments, 490 is a signal associated with output 290 of the voltage divider of FIG. 3, for example. In some embodiments, the control circuit or voltage dividers are associated with one or more phases or stages of operation 402, 404, 406, and 408, for example.

For example, during a first phase of operation at 402, the header gate 232 is biased low (not shown), the pull down gate 222 is biased high at 410, and the control circuit 110 biases the pull up gate 212 high at 420, thus activating the header unit 230 and deactivating at least one of the pull up unit 210 or the pull down unit 220. During the first phase of operation, the header unit 230 thus pulls the output 290 of the voltage divider to a logic high voltage at 490, such as Vdd 202 or a threshold drop below Vdd 202, for example.

During a second phase of operation at 404, the header gate 232 is biased high (not shown), the pull down gate 222 is biased low at 410, and the control circuit 110 biases the pull up gate 212 high at 420, thus deactivating at least one of the header unit 230 or the pull up unit 210 and activating the pull down unit 220. Accordingly, the pull down unit 220 thus pulls the output 290 of the voltage divider downward during the second phase of operation at 490, for example. In some embodiments, the second phase of operation is associated with a delay time, such as delay 404, for example.

During a third phase of operation at 406, the header gate 232 is biased high (not shown), the pull down gate 222 is biased low at 410, and the control circuit 110 biases the pull up gate 212 to a Vppu voltage level between a logic high voltage level 422 and a logic low voltage level 424, as seen at 420, thus deactivating the header unit 230 and activating the pull down unit 220. In some embodiments, the pull up unit 210 is at least partially activated, at least because the control circuit 110 is biasing the pull up gate 212 of the pull up unit 210 to the Vppu voltage level. Accordingly, the pull up unit 210 and the pull down unit 220 stabilize the output 290 of the voltage divider to a tunable voltage level at 490, for example. In some embodiments, the output 290 begins stabilization at 482, when the control circuit 110 activates the pull up unit 210, for example. In some embodiments, the output 290 is stabilized at 484. For example, 422 is a difference between the logic high voltage level and the Vppu voltage level. Similarly, 424 is a difference between the Vppu voltage level and the logic low voltage level.

During a fourth phase of operation at 408, the header gate 232 is biased low (not shown), the pull down gate 222 is biased high at 410, and the control circuit 110 biases the pull up gate 212 high at 420, thus activating the header unit 230 and deactivating at least one of the pull up unit 210 or the pull down unit 220. Accordingly, the header unit 230 thus returns the output 290 of the voltage divider to a logic high voltage at 490, such as Vdd 202 or a threshold drop below Vdd 202, for example. In some embodiments, the fourth phase of operation is the same as the first phase of operation.

Figure 5:
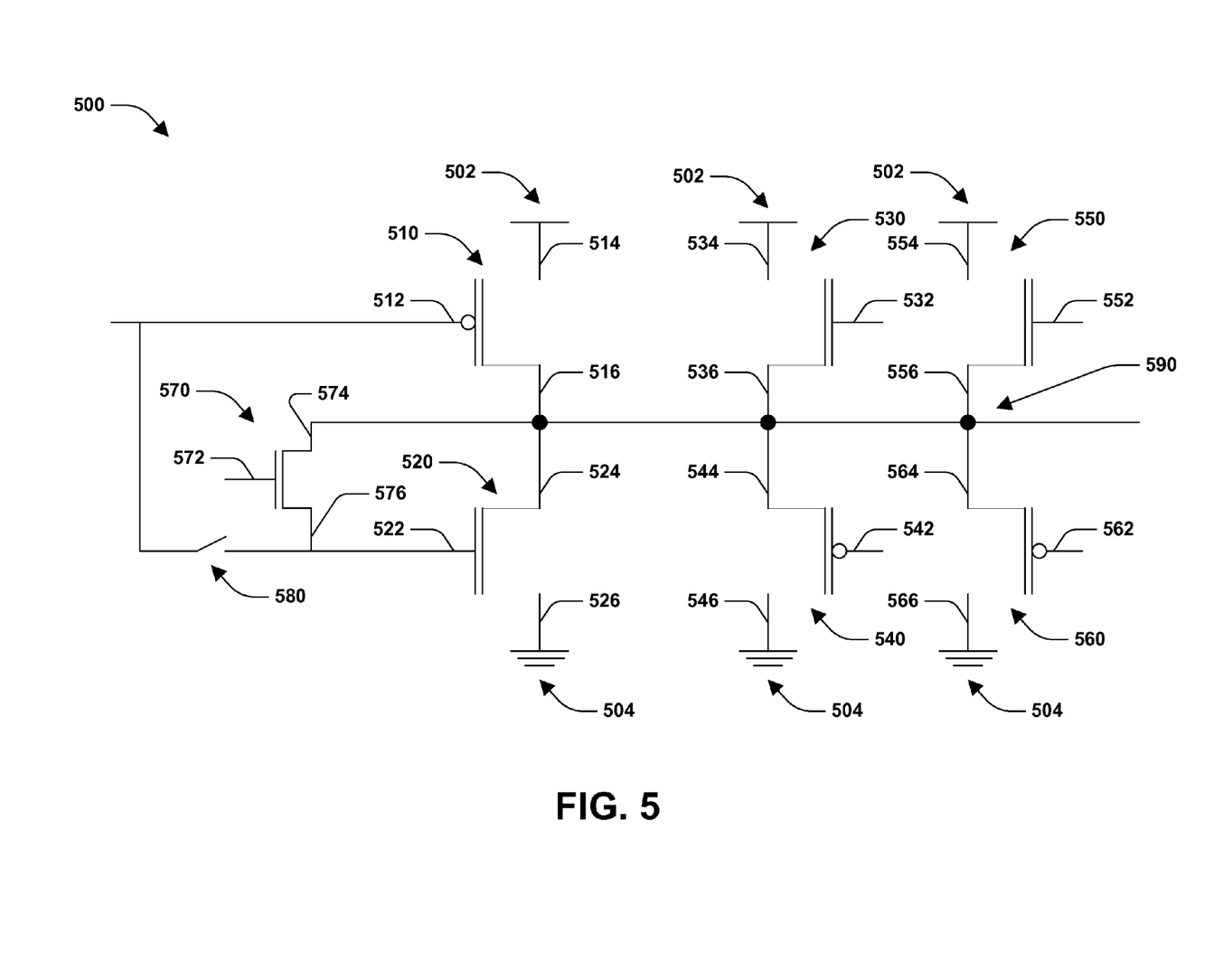
FIG. 5 is a schematic diagram of an example control circuit, according to some embodiments.

FIG. 5 is a schematic diagram 500 of an example control circuit, according to some embodiments. For example, FIG. 5 illustrates a control circuit configured to bias a pull up unit of a voltage divider. In some embodiments, the control circuit comprises a first transistor 510, a second transistor 520, a third transistor 530, a fourth transistor 540, a fifth transistor 550, a sixth transistor 560, and a seventh transistor 570. In some embodiments, the first transistor 510, the fourth transistor 540, and the sixth transistor 560 are p-type metal oxide semiconductor (PMOS) transistors. In some embodiments, the second transistor 520, the third transistor 530, the fifth transistor 550, and the seventh transistor 572 are n-type metal oxide semiconductor (NMOS) transistors. However, it will be appreciated that in other embodiments (not shown), the control circuit of FIG. 5 is configured to provide similar functionality utilizing a different configuration, for example. In some embodiments, the first transistor 510 comprises a first gate 512, a first source 514, and a first drain 516. In some embodiments, the fourth transistor 540 comprises a fourth gate 542, a fourth source 544, and a fourth drain 546. In some embodiments, the sixth transistor 560 comprises a sixth gate 562, a sixth source 564, and a sixth drain 566. Additionally, the second transistor 520 comprises a second gate 522, a second source 526, and a second drain 524, the third transistor 530 comprises a third gate 532, a third source 536, and a third drain 534, the fifth transistor 550 comprises a fifth gate 552, a fifth source 556, and a fifth drain 554, and the seventh transistor 570 comprises a seventh gate 572, a seventh source 576, and a seventh drain 574.

In some embodiments, the fifth gate 552 of the fifth transistor 550 is connected to a first NMOS select signal. In some embodiments, the sixth gate 562 of the sixth transistor 560 is connected to a first PMOS select signal. In some embodiments, the third gate 532 of the third transistor 530 and the seventh gate 572 of the seventh transistor 570 are connected to a second NMOS select signal. In some embodiments, the fourth gate 542 of the fourth transistor 540 is connected to a second PMOS select signal. In some embodiments, the first gate 512 of the first transistor 510 is connected to a third PMOS select signal.

In some embodiments, at least one of the first source 514, the third drain 534, or the fifth drain 554 is connected to a positive supply voltage (Vdd) 504. In some embodiments, at least one of the second source 526, the fourth drain 546, or the sixth drain 566 is connected to a negative supply voltage (Vss) 504.

In some embodiments, an output for the control circuit of FIG. 5 is at node 590. In some embodiments, node 590 is connected to at least one of the first drain 516, the second drain 524, the third source 536, the fourth source 544, the fifth source 556, the sixth source 564, or the seventh drain 574. In some embodiments, the second gate 522 of the second transistor 520 is connected to at least one of the seventh source 576 of the seventh transistor 570 or a switch 580. In some embodiments, the switch 580 is connected to at least one of the third PMOS select signal or the first gate 512 of the first transistor 510.

It will be appreciated that any combination of voltage dividers is used to achieve the control circuit 110 of FIG. 1. For example the control circuit 110 of FIG. 1 comprises at least one of a p-p voltage divider, an n-n voltage divider, a p-n voltage divider, an n-p voltage divider, a diode type voltage divider, etc. Additionally, the control circuit of FIG. 5 is merely an example, and other control circuits are contemplated herein.

Figure 6:
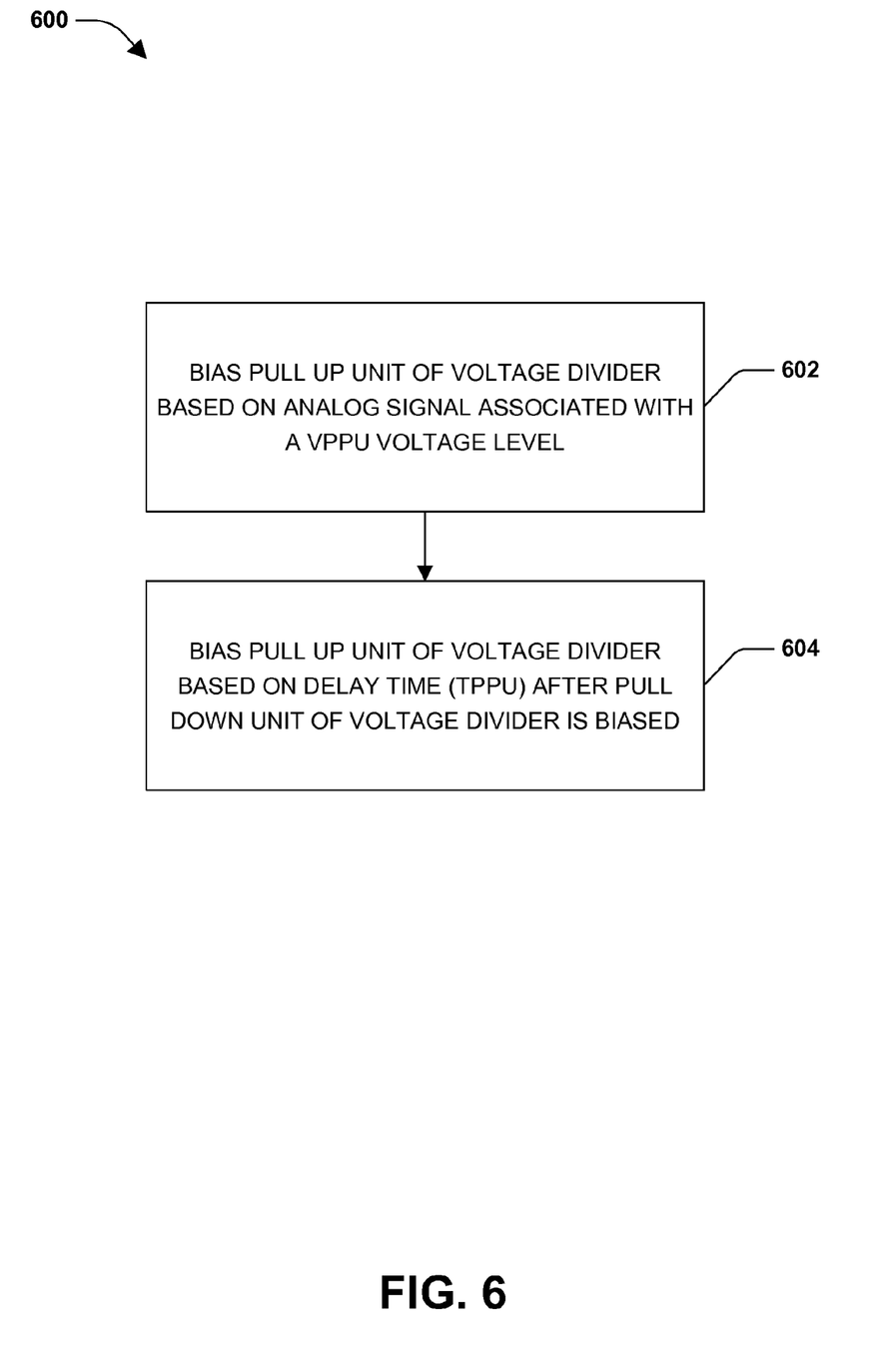
FIG. 6 is a flow diagram of an example method for controlling a voltage divider, according to some embodiments.

FIG. 6 is a flow diagram of an example method 600 for controlling a voltage divider, according to some embodiments. In some embodiments, the method 600 comprises biasing a pull up unit of a voltage divider based on an analog signal at 602. In some embodiments, the analog signal is associated with a Vppu voltage level. In some embodiments, the method 600 comprises biasing the pull up unit of the voltage divider based on a delay time (Tppu) after a pull down unit of the voltage divider is biased at 604. For example, the pull down unit is biased and the pull up unit is biased after the delay time has passed.

Figure 7:
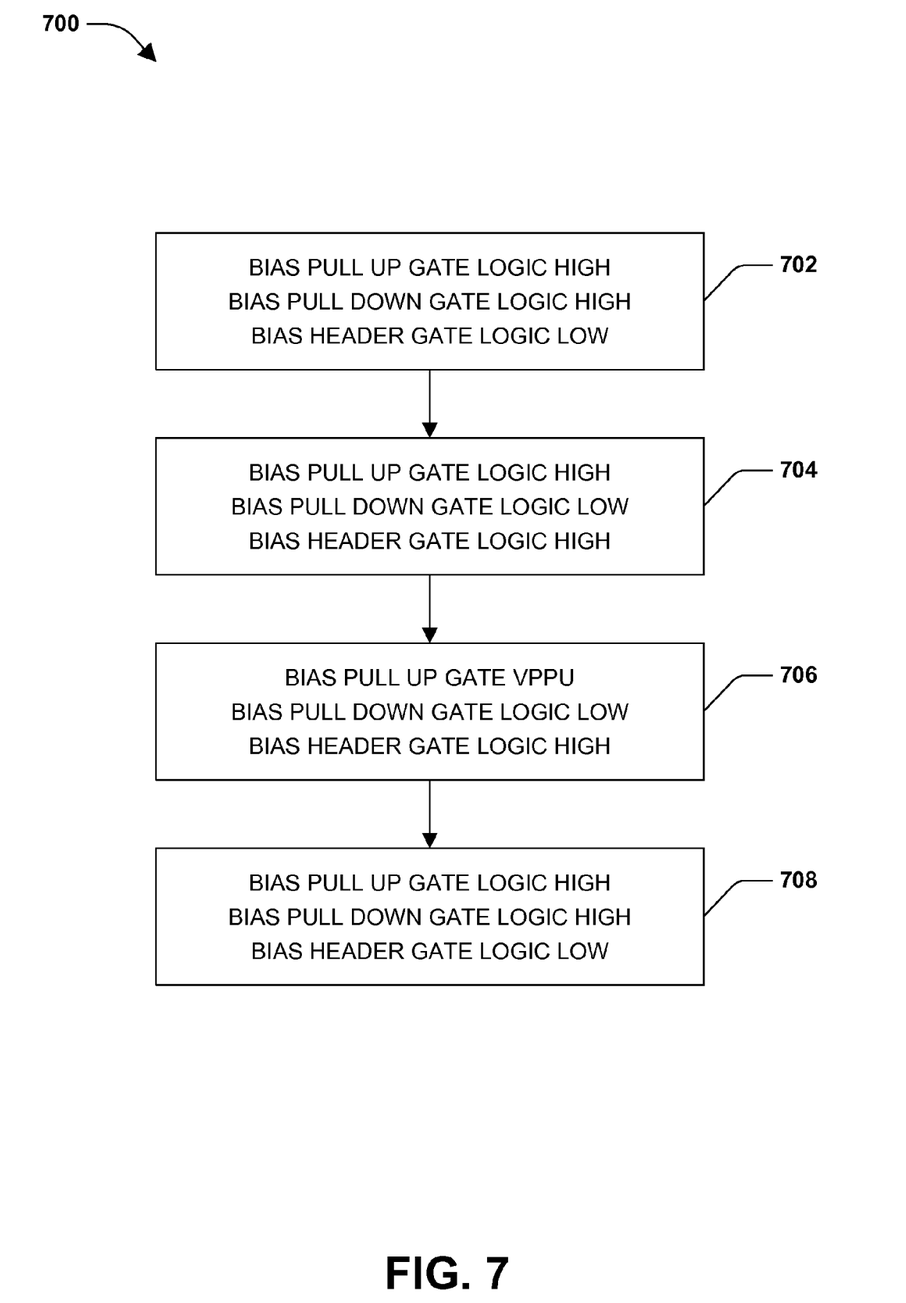
FIG. 7 is a flow diagram of an example method for controlling a voltage divider, according to some embodiments.

FIG. 7 is a flow diagram of an example method 700 for controlling a voltage divider, according to some embodiments. In some embodiments, the method 700 comprises a first stage associated with normal operation at 702. For example, at 702, the control circuit, such as the control circuit 110 of FIG. 1, FIG. 2, or FIG. 3, for example, is configured to generate a Vbias signal. In some embodiments, the Vbias signal is a logic high voltage level during normal operation, at least because this disables a pull up unit 210 of a voltage divider 250, for example. Additionally, a first signal is a logic low voltage level and is applied to a header gate 232 and a second signal is a logic high voltage level and is applied to a pull down gate 222. In some embodiments, the second signal is opposite of the first signal. In other words, when the first signal is a logic low voltage level, the second signal is a logic high voltage level, and vice versa, for example. It will be appreciated that in some embodiments, the first signal is independent of the second signal or the second signal is independent of the first signal, and are thereby independently controlled. In this way, the pull up gate 212 is biased logic high, the pull down gate 222 is biased logic high, and the header gate 232 is biased logic low at 702. Accordingly, the pull up unit 210 and the pull down unit 220 are off, and the header unit 230 is on, thereby outputting a Vdd or logic high voltage level to output 290 of the voltage divider 250. In some embodiments, the output 290 of the voltage divider 250 is connected to an array of one o more memory cells, as will be described in FIG. 8.

In some embodiments, the method 700 comprises a second stage at 704. For example, at 704, the control circuit 110 is configured to generate a Vbias signal. In some embodiments, the Vbias signal is a logic high voltage level during the second stage 704, at least because the pull up unit 210 of the voltage divider 250 is disabled, for example. Additionally, the first signal is a logic high voltage level and is applied to a header gate 232 and the second signal is a logic low voltage level and is applied to a pull down gate 222. Accordingly, the pull up gate 212 is biased logic high, the pull down gate 222 is biased logic low, and the header gate 232 is biased logic high at 704. Accordingly, the pull up unit 210 and the header unit 230 are off and the pull down unit 220 is on, thereby enabling the pull down unit 220 to lower or pull down an output voltage at output 290 of the voltage divider 250, at least because the pull down unit 220 is activated, for example.

In some embodiments, the method 700 comprises a third stage at 706. For example, at 706, the control circuit 110 is configured to generate a Vbias signal associated with a Vppu voltage level. In some embodiments, the Vppu voltage level is between Vss and Vdd, for example. Additionally, the first signal is a logic high voltage level and is applied to the header gate 232 and the second signal is the logic low voltage level and is applied to the pull down gate 222. Accordingly, the pull up gate 212 is biased at the Vppu voltage level, the pull down gate 222 is biased logic low, and the header gate 232 is biased logic high at 706. Accordingly, the header unit 230 is off and the pull down unit 220 is on, while the pull up unit 210 is at least partially enabled, thereby enabling the pull up unit 210 to stabilize the output voltage of output 290 to one or more Vppu voltage levels, at least because the pull up unit 210 is at least partially activated, for example. In this way, the output 290 of the voltage divider 250 is configured to output multiple voltage levels, at least because the control circuit 110 enables the pull up unit 210 to maintain various degrees of operation. At 708, the method 700 comprises returning the voltage divider to a normal operation during a fourth stage, such as a stage similar to the first stage of 702, such that the pull up gate 212 is biased logic high, the pull down gate 222 is biased logic high, and the header gate 232 is biased logic low, for example. Accordingly, the output 290 is pulled up towards a Vdd voltage level at 708.

Figure 8:
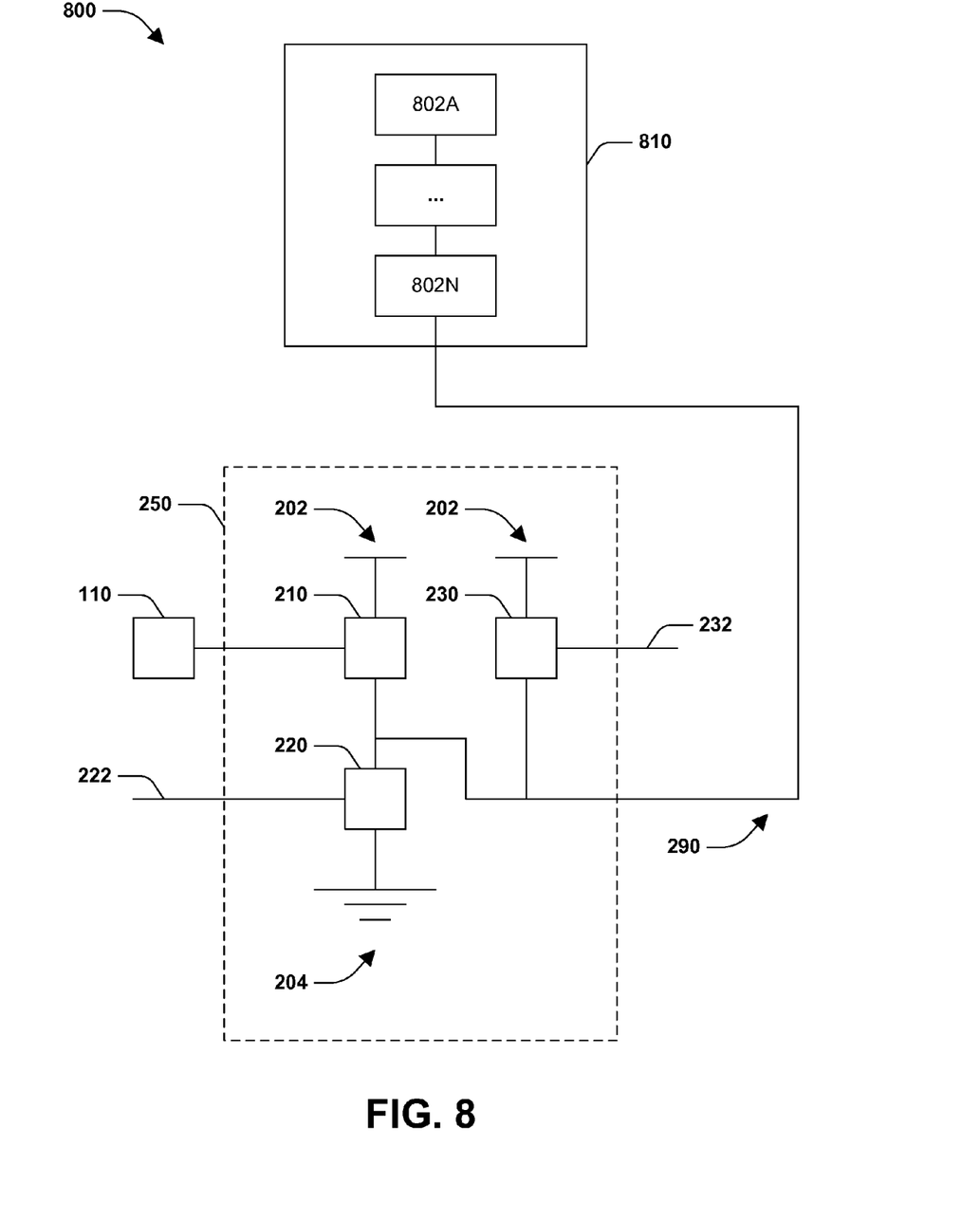
FIG. 8 is a schematic diagram of an example write assist circuit, according to some embodiments.

FIG. 8 is a schematic diagram 800 of an example write assist circuit, according to some embodiments. In some embodiments, the write assist circuit comprises a control circuit 110, a voltage divider 250, and an array of one or more memory cells 810. In some embodiments, the array of one or more memory cells 810 comprises a first memory cell 802A, one or more memory cells, and an Nth memory cell 802N, for example. In some embodiments, the voltage divider comprises a pull up unit 210, a pull down unit 220, and a header unit 230. In some embodiments, the array of one or more memory cells 810 is connected to an output of the voltage divider 250. In some embodiments, the control circuit 110 is configured to bias the pull up unit 210 of the voltage divider 250 by generating a Vbias signal that enables the pull up unit 210 to operate based on various degrees of operation, at least because the control circuit 110 is configured to provide the pull up unit 210 with an analog Vbias signal, for example. In some embodiments, the header unit 230 is configured to pull an output 290 of the voltage divider 250 towards a Vdd 202 voltage level, while the pull down unit 220 is configured to pull the output 290 of the voltage divider towards a Vss 204 voltage level. It will be appreciated that the header unit 230, the pull up unit 210, the pull down unit 220, and the control circuit 110 are configured to operation in conjunction to output multiple voltage levels for the array of one or more memory cells 810, for example. In some embodiments, a header gate 232 of the header unit 230 is connected to a first signal and a pull down gate 222 of the pull down unit 220 is connected to a second signal.

It will be appreciated that merely one control circuit 110 and voltage divider 250 enables multiple voltage levels to be output 290 to drive the array of one or more memory cells 810, at least because the control circuit 110 drives an analog signal to the pull up unit 210 of the voltage divider 250. In this way, pull up unit 210 of the voltage divider 250 is associated with various degrees of operation. In other words, the voltage divider 250 is therefore capable of outputting a number of voltage levels at output 290. Accordingly, the array of one or more memory cells 810 is set to three or more voltage levels, such as logic low, logic high, and one or more Vppu voltage levels between logic low and logic high, for example. In some embodiments, merely one voltage divider is used to drive the array of one or more memory cells 810, rather than multiple voltage dividers, for example.

Figure 9:
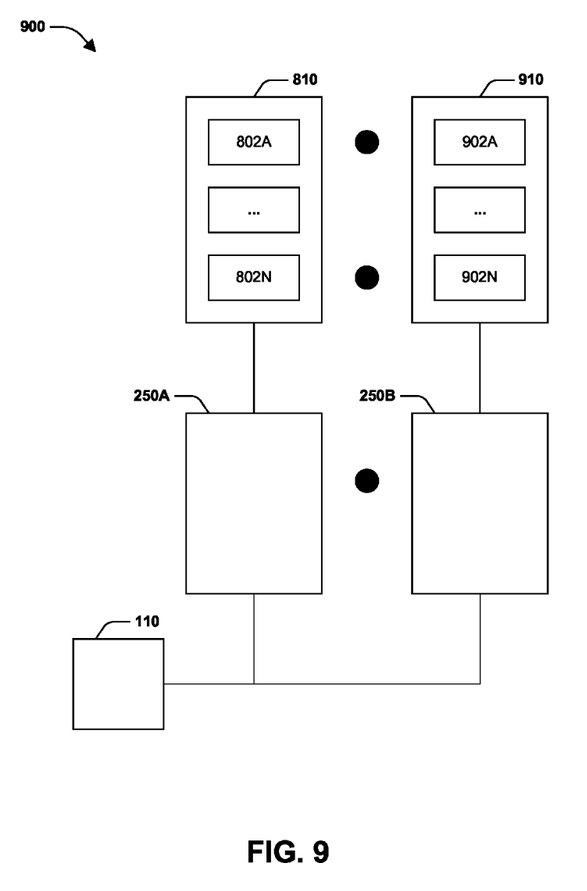
FIG. 9 is a schematic diagram of an example write assist circuit, according to some embodiments.

FIG. 9 is a schematic diagram 900 of an example write assist circuit, according to some embodiments. For example, the write assist circuit of FIG. 9 comprises a control circuit 110, a plurality of voltage dividers, and a plurality of memory cell arrays. For example, the plurality of voltage dividers comprises a first voltage divider 250A, one or more voltage dividers, and an Nth voltage divider 250B. For example, the plurality of memory cell arrays comprises a first memory cell array 810, one or more memory cell arrays, and an Nth memory cell array 910. In some embodiments, the first memory cell array 810 comprises a first memory cell 802A, one or more memory cells, and an Nth memory cell 802N. Similarly, the Nth memory cell array 910 comprises a first memory cell 902A, one or more memory cells, and an Nth memory cell 902N. In some embodiments, the control circuit 110 is configured to bias a pull up unit of respective voltage dividers 250A and 250B. Accordingly, it is seen that the control circuit 110 is configured to operate one or more voltage dividers for a corresponding plurality of memory cell arrays, at least because the control circuit 110 is connected to the first voltage divider 250A and the Nth voltage divider 250B. It will be appreciated that the first voltage divider 250A is connected to the first memory cell array 810 and the Nth voltage divider 250B is connected to the Nth memory cell array 910.

In some embodiments, the control circuit 110 is configured to bias a second pull up unit of a second voltage divider (not shown) using an analog signal associated with a Vppu voltage level. In some embodiments, the control circuit 110 is configured to bias the second pull up unit of the second voltage divider based on the Tppu associated with a second pull down unit of the second voltage divider.

Figure 10:
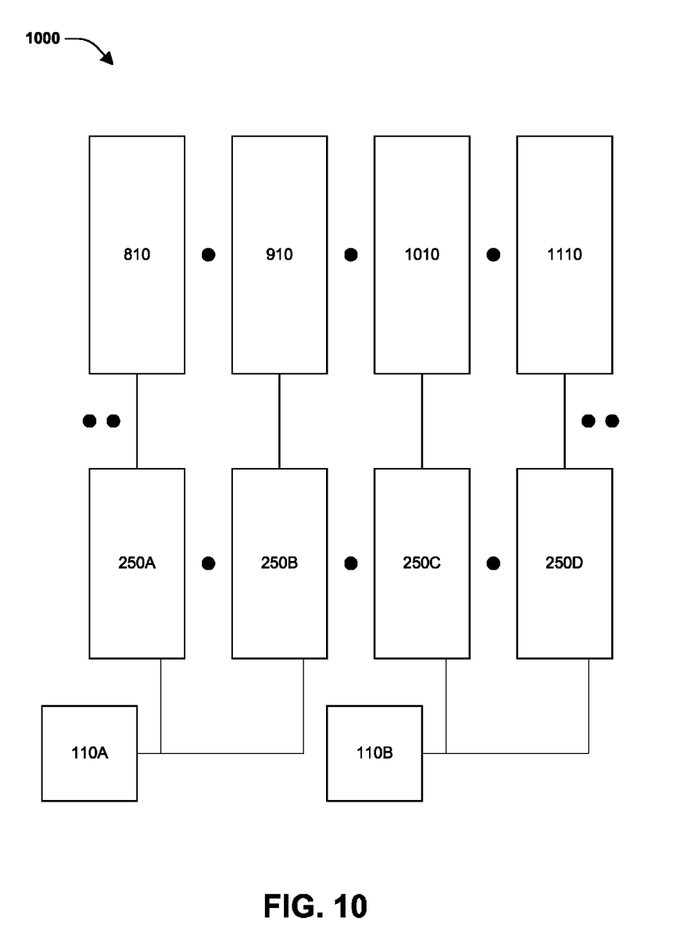
FIG. 10 is a schematic diagram of an example write assist circuit, according to some embodiments.

FIG. 10 is a schematic diagram 1000 of an example write assist circuit, according to some embodiments. It will be appreciated that FIG. 10 is similar to FIG. 9, except that the write assist circuit comprises a first control circuit 110A and an Nth control circuit 110B. The first control circuit 110A is connected to a first voltage divider 250A configured to drive a first memory cell array 810. The first control circuit 110A is connected to a second voltage divider 250B configured to drive a second memory cell array 910. The Nth control circuit 110B is also connected to a third voltage divider 250C configured to drive a third memory cell array 1010. The second control circuit 110B is also connected to a fourth voltage divider 250D configured to drive a fourth memory cell array 1110, etc. In this way, one or more control circuits 110A and 110B are configured to operate one or more corresponding voltage dividers 250A, 250B, 250C, 250D, etc. The control circuits 110A and 110B are configured to bias respective voltage dividers 250A, 250B, 250C, and 250D using an analog signal associated with a Vppu voltage level. Since the first voltage divider 250A and the second voltage divider 250B are both connected to the first control circuit 110A, the first memory cell array 810 and the second memory cell array 910 share the first control circuit 110A via voltage dividers 250A and 250B. Similarly, the third memory cell array 1010 and the fourth memory cell array 1110 share the Nth control circuit 110B.

One or more techniques or systems is provided for controlling a voltage divider. Generally, a voltage divider comprises a pull up unit, a pull down unit, and a header unit. In some embodiments, a control circuit is configured to bias the pull up unit using an analog signal. For example, the control circuit is configured to bias the pull up unit with a voltage between a logic high voltage level and a logic low voltage level. In this way, the control circuit enables the voltage divider to output multiple voltage levels. For example, the pull up unit is a p-type metal oxide semiconductor (PMOS) transistor and the pull down unit is also a PMOS transistor, according to some embodiments. In this example, the voltage divider outputs a first voltage level when the pull down unit is biased to a logic low voltage level and the pull up unit is biased to a logic low voltage level. Additionally, the voltage divider outputs a second voltage level when the pull down unit is biased to a logic low voltage level and the pull up unit is biased to a Vppu1 voltage level above the logic low voltage level and below a logic high voltage level. In some embodiments, the voltage divider outputs a third voltage level when the pull down unit is biased to a logic low voltage level and the pull up unit is biased to a Vppu2 voltage level above the Vppu1 voltage level and below a logic high voltage level, etc. In some embodiments, the control circuit is configured to bias the pull up unit based on a bias timing associated with the pull down unit of the voltage divider. For example, the control circuit is configured to bias the pull up unit of the voltage divider after a pull down unit of the voltage divider is biased. In this way, the control circuit enables the voltage divider to stabilize more quickly, at least because the delay associated with biasing the pull up unit enables the pull down unit to pull down more quickly when under a load, for example.

According to some aspects, a control circuit is provided. In some embodiments, the control circuit is configured to bias a pull up unit of a voltage divider using an analog signal associated with a Vppu voltage level. In some embodiments, the control circuit is configured to bias the pull up unit of the voltage divider based on a delay time (Tppu) associated with a pull down unit of the voltage divider.

According to some aspects, a write assist circuit is provided, comprising a voltage divider, an array of memory cells, and a control circuit. In some embodiments, the voltage divider comprises an output, a pull up unit, a pull down unit, and a header unit. In some embodiments, the array of memory cells comprises one or more memory cells. In some embodiments, at least some of the one or more memory cells is connected to the output of the voltage divider. In some embodiments, the control circuit is configured to bias the pull up unit of the voltage divider using an analog signal associated with a Vppu voltage level. In some embodiments, the control circuit is configured to bias the pull up unit of the voltage divider a delay time (Tppu) after the pull down unit of the voltage divider is biased.

According to some aspects, a method for controlling a voltage divider is provided, comprising biasing a pull up gate of a pull up unit of a voltage divider logic high during a first stage. In some embodiments, the method comprises biasing a pull down gate of a pull down unit of the voltage divider logic low during the first stage. In some embodiments, the method comprises biasing a header gate of a header unit of a voltage divider logic high during the first stage. In some embodiments, the method comprises biasing the pull up gate to a Vppu voltage level during a second stage. In some embodiments, the method comprises biasing the pull down gate logic low during a second stage. In some embodiments, the method comprises biasing the header gate logic high during the second stage.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A control circuit coupled to a pull up unit of a voltage divider, the pull up unit activated at a first voltage and deactivated at a second voltage, the control circuit configured to:
   identify an activation of a pull down unit of the voltage divider; and
   bias the pull up unit of the voltage divider using an analog signal associated with a Vppu voltage level, the Vppu voltage level between the first voltage and the second voltage, the analog signal applied a specified delay time (Tppu) after the activation of the pull down unit.

2. The control circuit of claim 1, configured to bias the pull up unit using the analog signal concurrently with the pull down unit being activated.

3. The control circuit of claim 1, configured to bias a second pull up unit of a second voltage divider using the analog signal.

4. The control circuit of claim 1, the bias configured to partially activate the pull up unit.

5. The control circuit of claim 1, configured to bias a plurality of voltage dividers using the analog signal, respective voltage dividers associated with one or more memory cell arrays.

6. The control circuit of claim 1, one or more memory cell arrays sharing the control circuit.

7. The control circuit of claim 1, the pull up unit comprising a pull up transistor.

8. The control circuit of claim 1, configured to bias the pull up unit based on a transistor size associated with the pull up unit.

9. The control circuit of claim 1, configured to bias the pull up unit based on a transistor size associated with the pull down unit.

10. The control circuit of claim 1, comprising a delay unit configured to generate the delay time.

11. A write assist circuit, comprising:
   a voltage divider comprising:
      an output;
      a pull up unit;
      a pull down unit; and
      a header unit;
   a memory cell array connected to the output; and
   a control circuit coupled to a pull up gate of the pull up unit and configured to
      bias the pull up unit using an analog signal associated with a Vppu voltage level, the Vppu voltage level between a first voltage at which the pull up unit is activated and a second voltage at which the pull uP unit is deactivated.

12. The write assist circuit of claim 11, the control circuit configured to bias the pull up unit using the analog signal concurrently with the pull down unit being activated.

13. The write assist circuit of claim 11, the control circuit configured to bias a second pull up unit of a second voltage divider using the analog signal.

14. The write assist circuit of claim 11, the bias configured to partially activate the pull up unit to vary a voltage at the output.

15. The write assist circuit of claim 11, the pull-up unit coupled to a voltage source.

16. The write assist circuit of claim 11, the control circuit configured to bias the pull up unit based on a transistor size associated with the pull up unit.

17. The write assist circuit of claim 11, the control circuit configured to bias the pull up unit based on a transistor size associated with the pull down unit.

18. The write assist circuit of claim 11, comprising a second control circuit configured to bias a second pull up unit of a second voltage divider using the analog signal after a second pull down unit of the second voltage divider is activated.

19. The write assist circuit of claim 11, the analog signal applied at a specified delay time (Tppu) after an activation of the pull down unit.

20. A method for controlling a voltage divider, comprising:
   biasing a pull up gate of a pull up unit of the voltage divider logic high during a first stage;
   biasing a pull down gate of a pull down unit of the voltage divider logic low during the first stage;
   biasing a header gate of a header unit of the voltage divider logic high during the first stage;
   biasing the pull up gate to a Vppu voltage level during a second stage, the Vppu voltage level between logic high and logic low;
   biasing the pull down gate logic low during the second stage; and
   biasing the header gate logic high during the second stage.

* * * * *